United States Patent [19]

Patel et al.

[11] Patent Number: 4,737,830
[45] Date of Patent: Apr. 12, 1988

[54] INTEGRATED CIRCUIT STRUCTURE HAVING COMPENSATING MEANS FOR SELF-INDUCTANCE EFFECTS

[75] Inventors: Bharat D. Patel, San Jose; Stephen Y. Tam, San Francisco; Pravin R. Shah, Sunnyvale, all of Calif.

[73] Assignee: Advanced Micro Devices, Inc., Sunnyvale, Calif.

[21] Appl. No.: 817,227

[22] Filed: Jan. 8, 1986

[51] Int. Cl.$^4$ ............................................. H01L 29/78
[52] U.S. Cl. .................................. 357/23.6; 357/41; 357/45; 357/46; 357/51; 357/68
[58] Field of Search ................... 357/23.6, 51, 41, 45, 357/46, 68

[56] References Cited

U.S. PATENT DOCUMENTS

| | | | |
|---|---|---|---|
| 4,493,056 | 1/1985 | Mao | 357/23.6 |
| 4,516,312 | 5/1985 | Tomita | 357/23.6 |
| 4,536,941 | 8/1985 | Kuo et al. | 357/23.6 |

Primary Examiner—Edward J. Wojciechowicz
Attorney, Agent, or Firm—Patrick T. King; John P. Taylor; J. Vincent Tortolano

[57] ABSTRACT

An improved integrated circuit structure is disclosed which comprises a Vcc bus and a Vss bus having capacitance means coupled between the busses and distributed along the length of the busses to reduce the voltage spikes induced during switching. In a preferred embodiment, the capacitance means comprise one or more capacitors formed beneath one of the busses. Construction of MOS capacitors beneath one or more of the busses is disclosed.

6 Claims, 11 Drawing Sheets

INTEGRATED CIRCUIT STRUCTURE HAVING COMPENSATING MEANS FOR SELF-INDUCTANCE EFFECTS

BACKGROUND OF THE INVENTION

1. Field of the Invention

This invention relates to an improved integrated circuit structure. More particularly, this invention relates to an improved integrated circuit structure having compensating means for self-inductance effects and a method of forming the compensating means.

2. Description of the Related Art

With advancement in process technologies, very large scale integrated circuit (VLSI) structures are becoming increasingly denser, larger, and faster. Such structures require many output pins to switch simultaneously. Also, with increasing clock speeds, the pins need to switch very quickly, i.e., within 20-30 nanoseconds or even faster. Due to system and testing requirements, the capacitive loading on these pins is 100 to 150 pf. All of these factors combine to make very high peak current requirements on the Vcc and Vss busses. These peak currents can make voltage spikes on the Vcc and Vss busses large enough to cause malfunctions in the chip logic. Also the voltage levels of non-switching outputs can be degraded while a large number of other outputs are switching.

With faster switching times, longer power and ground paths due to larger die size, and larger packages to house larger devices, inductive voltages encountered during switching, due to the self-inductance of power busses, bond wires and package leads, becomes important. Such induced voltages can adversely effect switching speeds and can result in noise spikes on the Vcc and Vss busses which can, in turn, cause soft errors.

It has been proposed to solve or alleviate the problems caused by voltage spikes induced by the inductance in the busses and leads by slowing down the outputs, increasing the widths of the Vcc and Vss busses, increasing the number of power pads, providing separate power pads for input and output, changing the pin-out configuration, or changing the package type.

Unfortunately, each of these solutions involves other problems. Slowing down the outputs can affect the AC timing while increasing the widths of the busses will have a limited positive effect on the self-inductance effect. More power pads and/or separate power pads for input and output will result in a higher pin count which can raise the package cost. Existing pin-out definition may also limit the addition of more power pads or the changing of pin-out configuration. Changing of the package type may be limited by the package type used in an existing product.

It would, therefore, be desirable to provide an improved integrated circuit structure wherein the problems of induced voltages and high current needs would be alleviated or compensated for.

SUMMARY OF THE INVENTION

It is, therefore, an object of this invention to provide an improved integrated circuit structure having faster switching speed.

It is another object of this invention to provide an improved integrated circuit structure having faster switching speed with lower Vss and Vcc induced voltage spikes during switching.

It is yet another object of this invention to provide an improved integrated circuit structure wherein the occurrence of soft errors, caused by Vcc and Vss noise due to induced voltage spikes during switching, is reduced.

It is a further object of this invention to provide an improved integrated circuit structure having better reliability by reduction of the induced voltage spikes during switching.

It is yet a further object of the invention to provide an improved integrated circuit structure wherein voltage spikes induced during switching are reduced by the provision of capacitance means distributed along the Vcc and Vss busses.

It is still a further object of this invention to provide a method for providing such capacitance means in an integrated circuit structure while minimizing impact on the space in the structure.

These and other objects of the invention will be apparent from the following description and accompanying drawings.

In accordance with the invention an improved integrated circuit structure comprises a Vcc bus and a Vss bus having capacitance means coupled between the busses and distributed along the length of the busses. In a preferred embodiment, the capacitance means comprises one or more capacitors formed beneath one or both of the busses.

DESCRIPTION OF THE PREFERRED EMBODIMENTS

Figure 1:
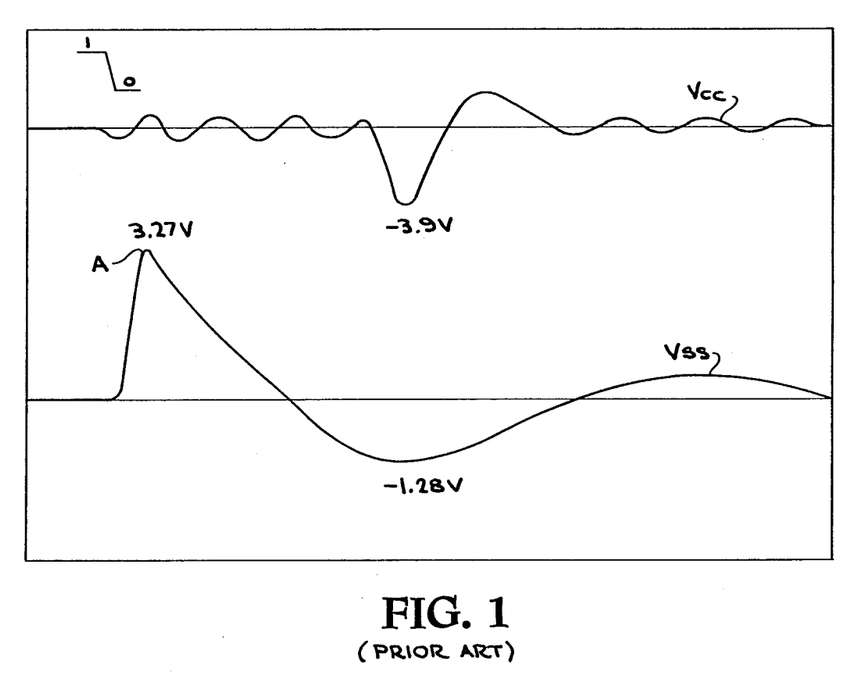
FIG. 1 is a graph showing the induced voltage spike occurring on a prior art Vss bus during switching from high to low.
Figure 2:
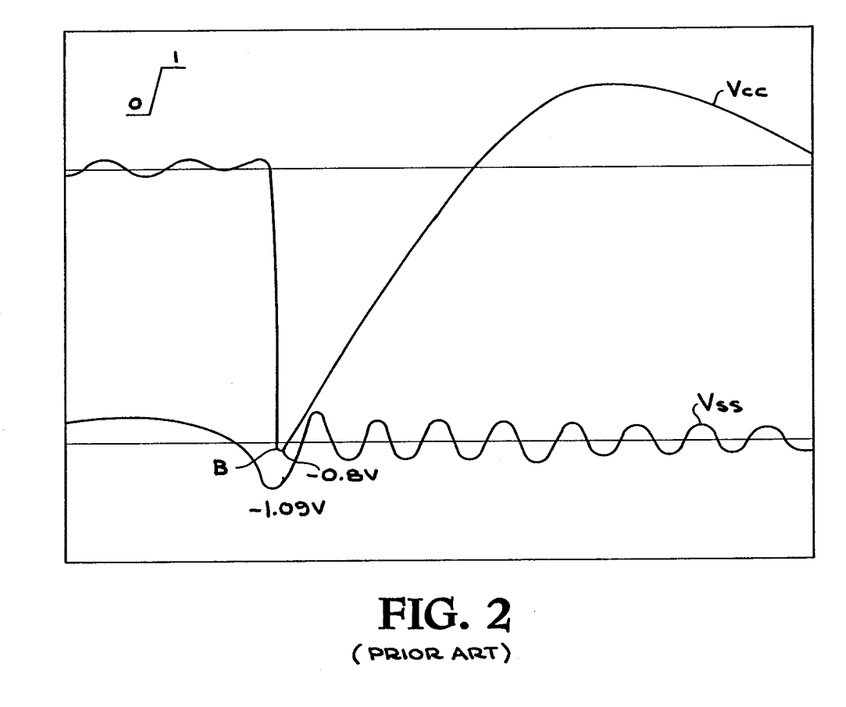
FIG. 2 is a graph showing the induced voltage spike occurring on a prior art Vcc bus during switching from low to high.

Referring now to FIGS. 1 and 2, the prior art problem of induced voltages during switching is graphically illustrated. In FIG. 1, the inductance in the Vss line or bus causes an induced positive voltage spike at point A when the external I/O changes from high to low and the external capacitor is discharged through the Vss ground line. Similarly, in FIG. 2, when the I/O is switched from low to high, the external capacitor must be charged through the Vcc line or bus. The inductance in this line induces a negative voltage spike, shown in FIG. 2 at point B, as current flows through the Vcc line to charge the external load capacitance.

Figure 3A:
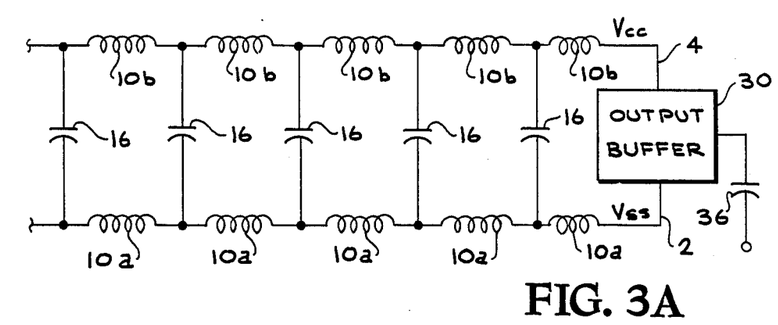
FIG. 3A is a schematic diagram showing capacitance means between the Vcc and Vss busses and distributed along the length of the busses.
Figure 3B:
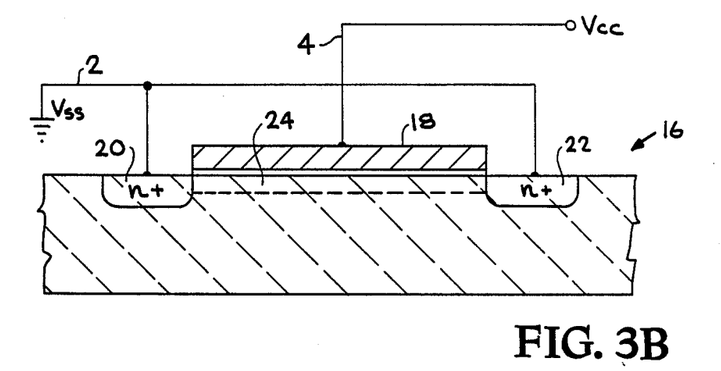
FIG. 3B is a pictorial schematic diagram showing the capacitance means connected between the Vcc and Vss busses in the form of an MOS capacitor.

In accordance with the invention, as shown in FIGS. 3A and 3B, the residual inductance 10a and 10b, respectively in Vss bus 2 and Vcc bus 4, is compensated for by providing capacitance shown in the form of capacitors 16 between the busses. As will be discussed in more detail below, capacitors 16 are shown as distributed along the busses to compensate for the inductance in the lines which is also shown as distributed along the length of each bus. Capacitors 16 act as charge reservoirs along busses 2 and 4 which can supply and store charges to the output buffers. This results in a lower dI/dt value on the Vss and Vcc busses and associated lead wires. Since the voltage drop or rise due to self-inductance effects is proportional to dI/dt, the net result is a much lower spiking noise on the Vss and Vcc busses.

When output buffer 30 switches from high to low or low to high and external load capacitor 36 is respectively discharged or charged, capacitors 16 compensate for the inductance in the lines. That is, for example, when the I/O drops from high to low and external capacitor 16 is discharging through the Vss ground line, the positive voltage induced by inductance 10a in Vss line 2 is bucked or reduced by the charge on capacitors 16 which will attempt to discharge into bus 2 as the induced voltage rises.

Capacitor 16 is also depicted in FIG. 3B. In FIG. 3B, capacitor 16 is illustrated in the form of an MOS capacitor connected between the Vss bus and the Vcc bus. Gate electrode 18 forms one plate of capacitor 16 which is shown as connected to Vcc bus 4, while channel 24 forms the other plate of the capacitor which is shown as connected through the source and drain electrodes, 20 and 22, to Vss bus 2. Since the Vss and Vcc busses in a typical VLSI chip or die are fairly wide, such an MOS capacitor can be formed beneath one or both of the busses to thereby have a minimum impact on the available space on the die. The construction of such an MOS capacitor beneath the Vss bus is shown progressively in FIGS. 4–13. It will be understood, however, that the capacitor could also be constructed similarly beneath the Vcc bus.

FIGS. 4–13 illustrate formation of N+ doped source and drain regions formed using conventional doping techniques well known to those skilled in the art such as diffusion or ion implantation or the like, corresponding to the construction of a typical NMOS type device. However, it will be appreciated that for purposes of the present invention, MOS capacitor 16 could be constructed using P type doping as well to form a PMOS type device in which case the gate electrode would be connected to the Vss bus and the source and drain connected to the Vcc bus.

Figure 4:
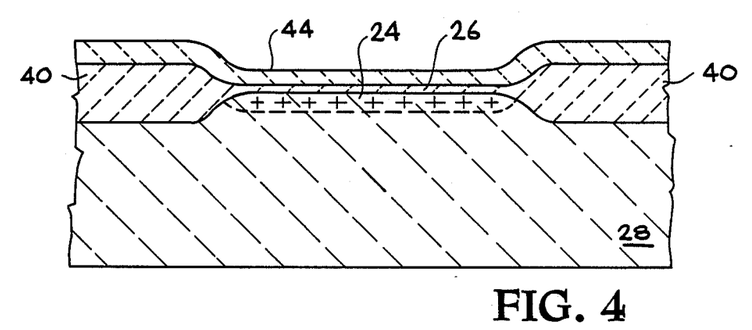
FIG. 4 is a fragmentary end view of a first stage of constructing the capacitance means of the invention beneath one of the busses.

Referring now to FIG. 4, a silicon substrate 28, previously masked to permit growth of field oxide 40 and gate oxide 26 followed by selective enhancement doping of substrate 28, is shown with a polysilicon layer 44 formed over field oxide 40 and gate oxide 26.

Figure 5:
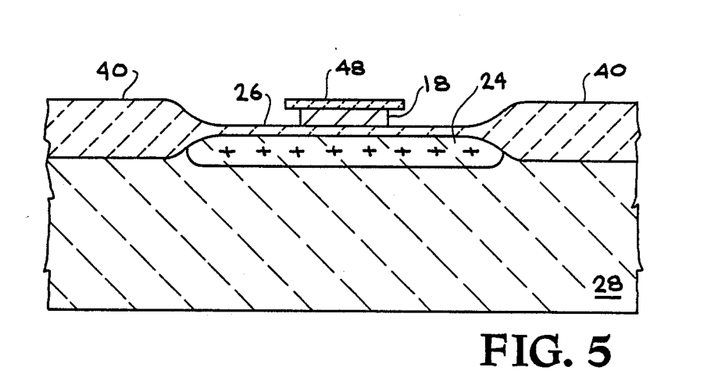
FIG. 5 is a fragmentary end view in section of a subsequent stage in the construction of the capacitive means of the invention.

A nitride mask layer 48 is formed over polysilicon layer 44. Nitride layer 48 is then masked and polysilicon layer 44 is selectively etched to form gate electrode 18 as shown in FIG. 5 as well as contact tab 19 shown in FIG. 6.

Figure 6:
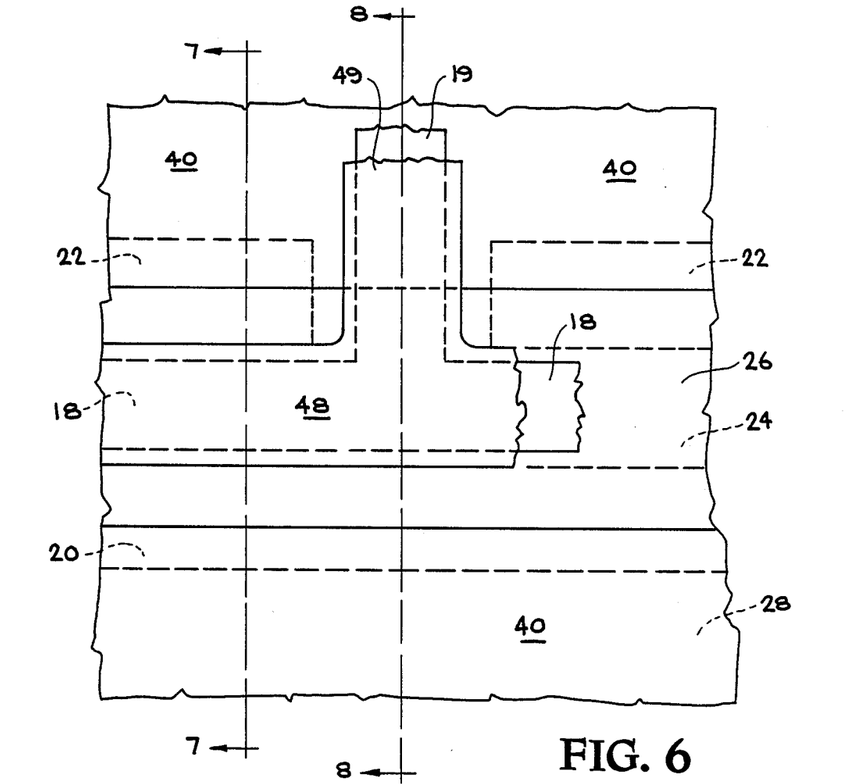
FIG. 6 is a fragmentary top view of the next stage of construction of the capacitance means of the invention.
Figure 7:
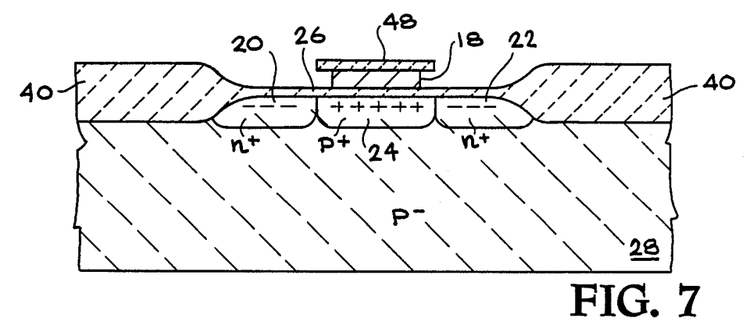
FIG. 7 is a fragmentary end view in section of the structure of FIG. 6 along the lines 7—7.
Figure 8:
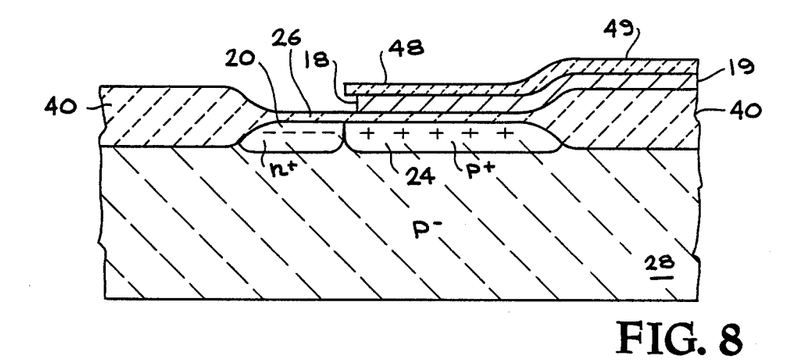
FIG. 8 is a fragmentary end view in section of the structure of FIG. 6 along the lines 8—8.

Referring now to FIGS. 6–8, source region 20 and drain region 22 are conventionally formed in substrate 28 by N+ doping of the substrate using field oxide 40 and nitride mask 48 as self-aligning masks. It will be noted, in FIGS. 6 and 8, that drain region 22 is interrupted where tab 19 is formed under nitride mask portion 49 as an extension of polysilicon gate 18 to permit subsequent electrical attachment of gate 18 through tab 19 to a lead extending to the Vcc bus as will be described.

The width of source 20 and drain 22 may be minimal with respect to the channel 24 which forms beneath gate 18 since the width of channel 24 and the overlying gate electrode 18 will determine the size of capacitor 16. As an example, when the width of the overlying bus, e.g., the Vss bus, is 8 mils, source and drain regions 20 and 22 may be about 0.25 mils wide leaving 7.5 mils for the channel and gate.

Figure 9:
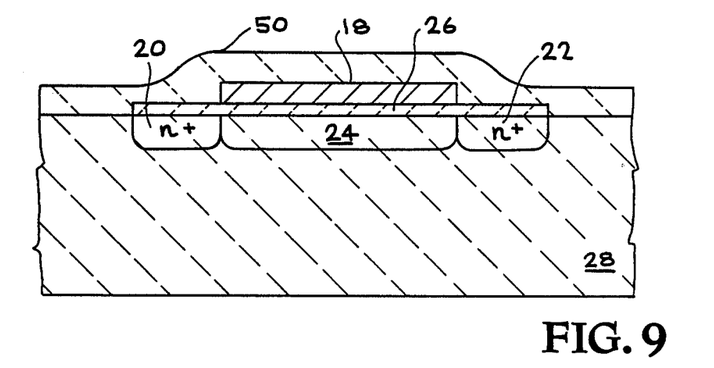
FIGS. 9–11 are fragmentary end views in section of further processing steps at the same position in FIG. 6 as shown in FIG. 7.

After formation of source region 20 and drain region 22, nitride mask 48, including portion 49, is stripped and a field oxide layer 50 is formed by deposition or growth as shown in FIG. 9 (in which oxide layer 40 is shown as part of oxide layer 50).

Figure 10:
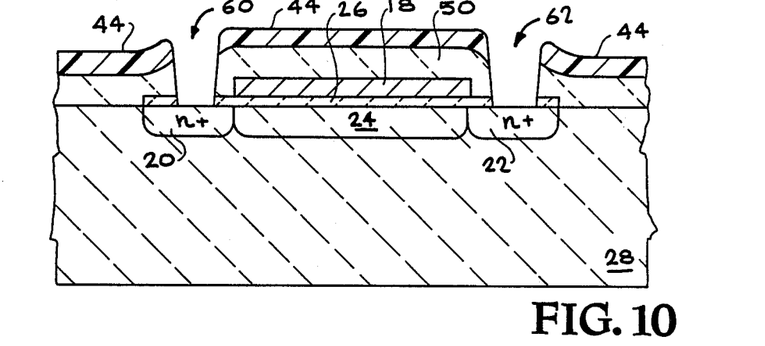
Figure 12:
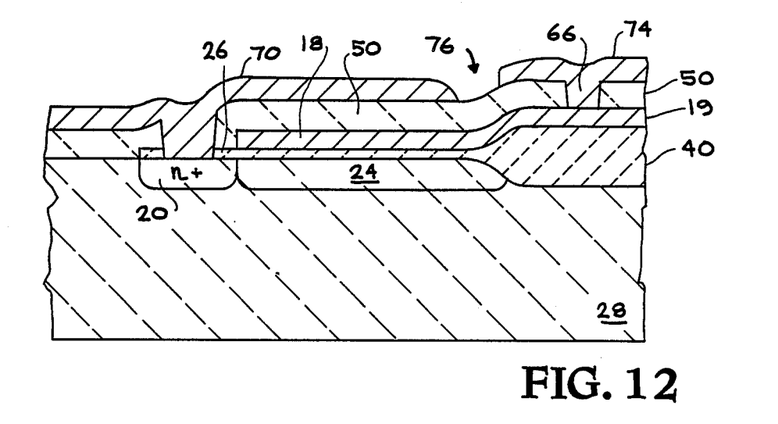
FIG. 12 is a fragmentary end view of the structure at the same position in FIG. 6 as shown in FIG. 8.

Oxide layer 50 may then be masked with photoresist layer 44 and selectively etched to form source and drain contact openings 60 and 62 as seen in FIG. 10 as well as an opening 66 to polysilicon contact portion 19 (FIG. 12).

Figure 11:
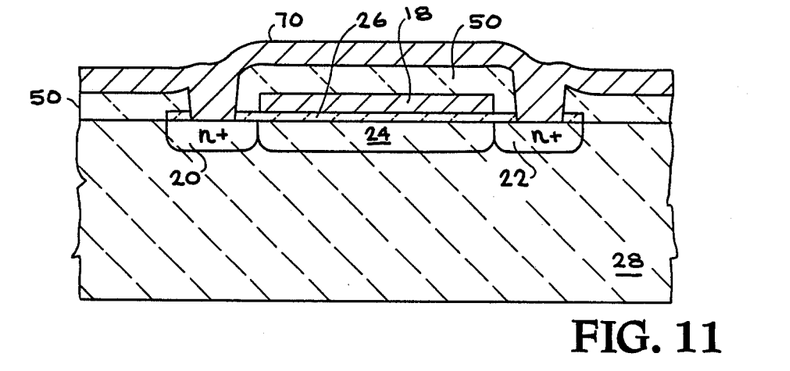
Figure 13:
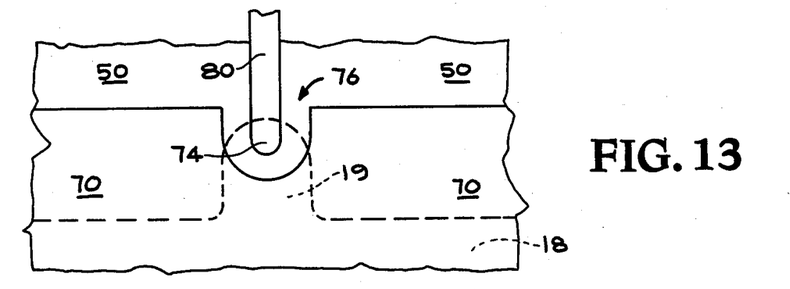
FIG. 13 is a fragmentary top view of the structure shown in FIG. 12.

A metal layer 70 such as aluminum is then deposited over the structure, as shown in FIGS. 11 and 12, which enters contact openings 60, 62, and 66. The cross-section shown at FIG. 12 corresponds to the position of the cross-section depicted in FIG. 8, i.e., at the point of the interruption of drain 22 where the contact 19 portion of gate electrode 18 is formed. Metal layer 70 may then be masked and etched at 76 in FIG. 12 to isolate metal portion 74 over gate contact 19 as best seen in FIG. 13. Alternatively, oxide layer 50 could be masked as 76 prior to deposition of metal layer 70 to provide the desired isolation of portion 74 from the remainder of metal layer 70. Portion 74, in turn communicates with metal line 80 which interconnects gate electrode 18 with Vcc bus 4 as shown schematically in FIG. 3B.

After completion of the forming of metal layer 70 (which may also function as the bus, e.g., the Vss bus in the illustrations, a layer of protective oxide (not shown) may be formed over the entire structure.

Figure 14:
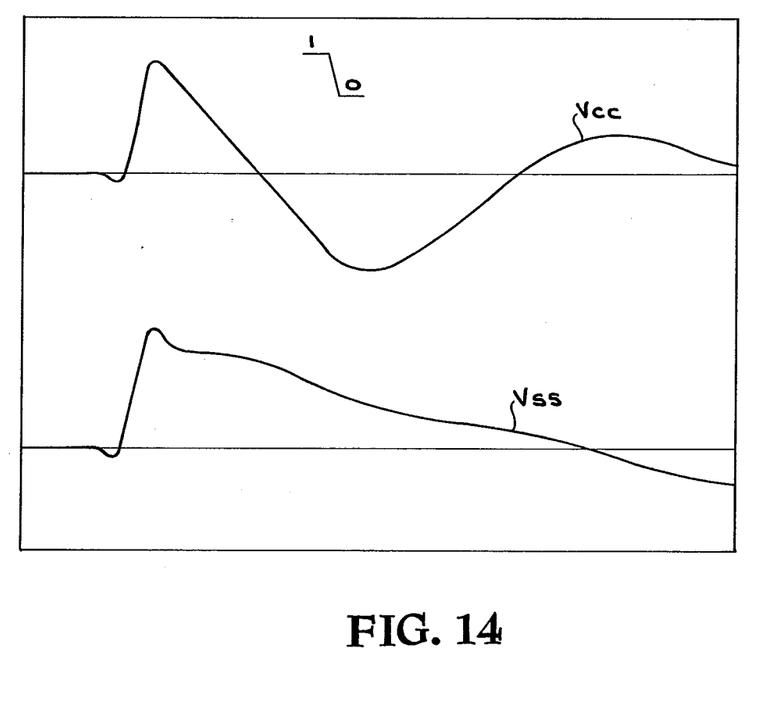
FIG. 14 is a graph showing the induced voltage spike occurring during switching from high to low on a Vss bus constructed with the distributed capacitance means of the invention.
Figure 15:
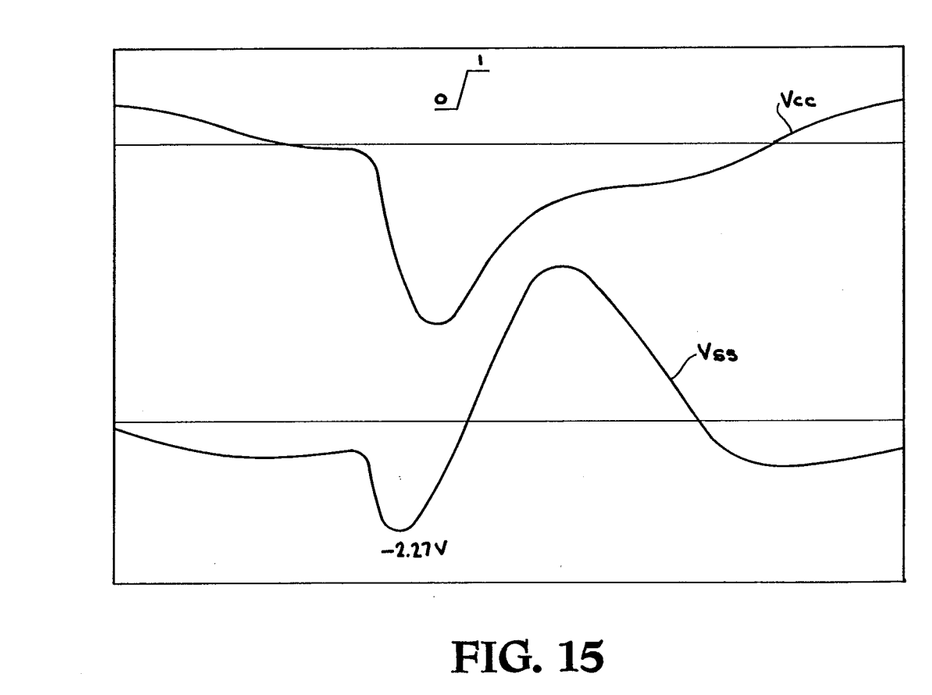
FIG. 15 is a graph showing the induced voltage spike occurring during switching from low to high on a Vcc bus constructed with the capacitance means of the invention.

FIGS. 14 and 15 respectively show the inductive voltage spikes on the Vss and Vcc lines when the I/O goes from high to low (FIG. 14) or from low to high (FIG. 15) with the capacitor of the invention coupled between the busses as just described. It will be noted that while the curves indicate voltage change on each bus, the delta or difference in voltage between the two busses remains closer to constant during such change thus reducing the chance of soft errors. It should be further noted in this regard that the amount of capacitance needed for a particular set of busses to balance the inductance of the lines may need to be adjusted based on empirical observations.

Figure 16:
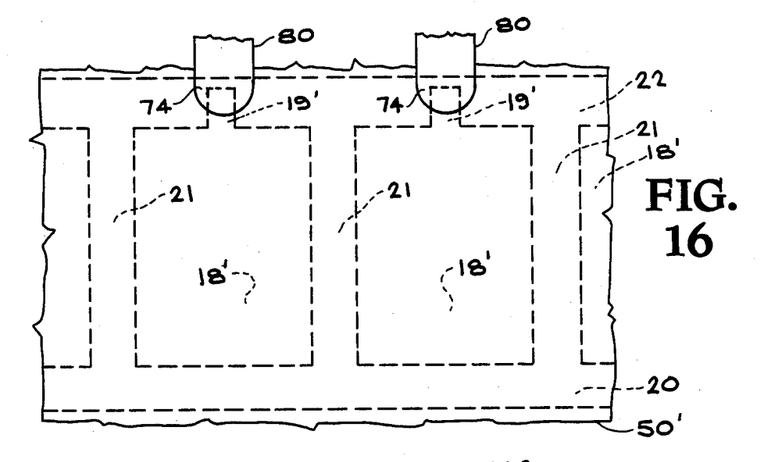
FIG. 16 is a fragmentary top view of another embodiment of the invention.

FIG. 16 depict a modification of the capacitor construction shown in the preceding FIGS. 4–13. In this embodiment capacitor 16 is provided with a number of separate gate electrodes 18'. Each gate electrode 18' has a separate tabs 19' which contacts metal portion 74 of line 80 to connect the electrode with Vcc bus 4. Gate electrodes 18' are formed similarly to that of gate electrode 18 as described with respect to FIGS. 5–8. However, since the source and drain regions are formed by self-aligning masks, interruption of gate electrode segments 18' results in the formation of additional N+ regions in substrate 28 depicted in FIG. 16 at 21 which interconnect source region 20 with drain region 22. Subsequent formation of oxide 50' insulates the independent gate electrodes 18' from one another.

This modification offers several advantages. Additional vias can be formed through oxide layer 50 to interconnect not only N+ contact regions 20 and 22, but region 21 as well with the overlying bus, i.e., the Vss bus in the illustrated embodiment. This serves to further lower the resistance between the Vss bus and channel 24, i.e., the lower plate of capacitor 16.

The separation of gate electrode 18 into separate segments 18' also permits isolation of any defects e.g., defects in gate oxide layer 26 or oxide layer 50. In this embodiment, the occurrence of such a defect could result in sufficient current flow to sever the connection between the polysilicon gate electrode 18' at tab 19' with the overlying metal tab 74 similar to a fuse melting. While this would result in the loss of that portion of the overall capacitance, it would be preferable to loss of either the entire capacitor or the entire die due to such a shorting defect.

Figure 17:
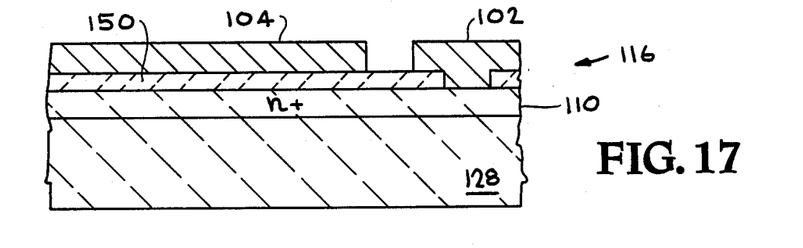
FIG. 17 is a fragmentary side view in section of still another embodiment of the invention.

Turning to FIG. 17, another embodiment is illustrated wherein a capacitor 116 is formed by first doping substrate 128 to form an N+ region or layer 110 adjacent the surface of substrate 128 which will form one plate of capacitor 116. A dielectric layer 150 is then formed over layer 110, e.g., by forming a layer of silicon dioxide. Metal layer 104 is then deposited over dielectric 150 to form the other plate of the capacitor. Metal layer 104 may also comprise the Vss bus or the Vcc bus. Connection is then made from doped layer 110 to the other bus via contact 102. As in the embodiment shown in FIG. 16, capacitor 116 may be separated into several electrically independent capacitors by interruption of layer 110.

Figure 18:
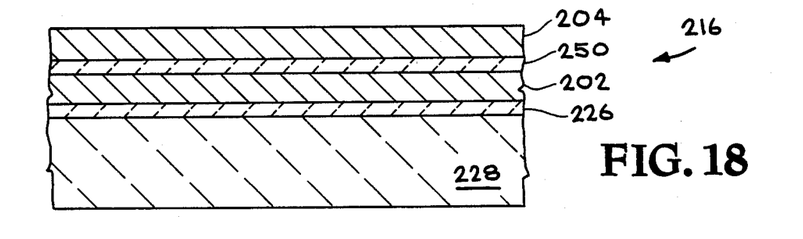
FIG. 18 is a fragmentary end view in section of yet another embodiment of the invention.

Yet another embodiment is illustrated in FIG. 18 wherein an oxide layer 226 over substrate 228 underlies a first metal layer 202. Dielectric oxide layer 250 over metal layer 202 electrically separates metal layer 202 from a second metal layer 204. Metal layers 202 and 204 may respectively comprise the Vss and Vcc busses or one of the metal layers may comprise one of the busses while the other layer serves only as the other plate of the capacitor which would then be interconnected with the other bus by appropriate leads.

Thus, the invention provides an improved integrated circuit structure wherein capacitance means are provided to compensate for the inductance in the busses whereby inductive voltages occurring in the busses during switching operations do not result in inductive voltage spikes of as great a magnitude. Reduction of such inductive noise result in a structure having greater reliability and less prone to soft errors.

Having thus described the invention, what is claimed is:

1. In an improved integrated circuit structure comprising a semiconductor substrate having a plurality of active devices formed therein with a Vcc current bus and a Vss bus connected to said active devices thereon, the improvement comprising:

(a) capacitance means formed beneath at least one of said busses comprising one or more MGS capacitors having a gate electrode forming a first plate of said capacitance means and electrically connected to one of said busses by at least one conductive path between said first plate and said one of said busses;

(b) a doped region formed in said substrate beneath said gate electrode comprising the opposite plate of said capacitance means and separated from said gate electrode by gate oxide means formed on said substrate; and (c) electrode means comprising a source/drain in said substrate contiguous with said doped region and electrically connecting said doped region of said MOS capacitor to the other of said busses;

whereby inductance voltages induced in said busses during switching will be compensated for by said capacitance means electrically connected directly between said busses and distributed along said busses to thereby reduce the voltage spikes produced by said induced voltages.

2. The improved integrated circuit structure of claim 1 wherein said capacitance means comprise more than one of said MOS capacitors.

3. The integrated circuit structure of claim 1 wherein said doped region is electrically connected to said other bus through either the source or drain electrodes or both.

4. The integrated circuit structure of claim 1 wherein the amount of capacitance is adjusted by varying the thickness of the gate oxide separating the gate electrode from said underlying doped region.

5. The integrated circuit structure of claim 1 wherein said gate electrode under said bus is divided into a plurality of segments and each of said segments is independently connected electrically at a spaced apart point to one of said busses to thereby form a plurality of parallel capacitors distributed along said busses.

6. The integrated circuit structure of claim 5 wherein insulating means are provided to isolate each of said adjacent gate electrode segments in said structure from one another.

* * * * *